(12) United States Patent
Lee et al.

(10) Patent No.: US 11,031,077 B2
(45) Date of Patent: Jun. 8, 2021

(54) RESISTANCE VARIABLE MEMORY DEVICE

(71) Applicant: SK hynix Inc., Icheon-si (KR)

(72) Inventors: Ki Won Lee, Cheongju-si (KR); Jin Su Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/715,343

(22) Filed: Dec. 16, 2019

(65) Prior Publication Data

US 2020/0327939 A1     Oct. 15, 2020

(30) Foreign Application Priority Data

Apr. 11, 2019     (KR) .................. 10-2019-0042510

(51) Int. Cl.
*G11C 13/00* (2006.01)
*H01L 27/24* (2006.01)

(52) U.S. Cl.
CPC ...... *G11C 13/0069* (2013.01); *G11C 13/0026* (2013.01); *H01L 27/2463* (2013.01); *G11C 2013/0078* (2013.01)

(58) Field of Classification Search
CPC . G11C 13/0069; G11C 22/31; G11C 2213/30; G11C 2213/70
See application file for complete search history.

(56) References Cited

U.S. PATENT DOCUMENTS

| | | | |
|---|---|---|---|
| 9,286,975 B2 | 3/2016 | Chu et al. | |
| 9,792,986 B2 | 10/2017 | Taub et al. | |
| 2011/0116300 A1* | 5/2011 | Maejima | G11C 13/0004 365/148 |
| 2013/0070534 A1* | 3/2013 | Carter | G11C 7/12 365/189.05 |
| 2014/0043887 A1* | 2/2014 | Lym | G11C 7/02 365/148 |
| 2019/0043576 A1* | 2/2019 | Banerjee | G11C 13/0026 |

\* cited by examiner

*Primary Examiner* — Han Yang
(74) *Attorney, Agent, or Firm* — William Park & Associates Ltd.

(57) ABSTRACT

A resistance variable memory device may include a plurality of memory cells and a control circuit block. The memory cells may be connected between a global word line and a global bit line. The control circuit block may control the memory cells. The control circuit block may include a write pulse control block. The write pulse control block may include a high resistance path circuit and a bypass circuit connected between the global word line and a selected memory cell. The write pulse control block may selectively enable any one of the high resistance path circuit and the bypass circuit in accordance with a position the selected memory cell.

19 Claims, 9 Drawing Sheets

210

RESISTANCE VARIABLE MEMORY DEVICE

CROSS-REFERENCES TO RELATED APPLICATION

The present application claims priority under 35 U.S.C. § 119(a) to Korean application number 10-2019-0042510, filed on Apr. 11, 2019, in the Korean Intellectual Property Office, which is incorporated herein by reference in its entirety.

BACKGROUND

1. Technical Field

Various embodiments may generally relate to a non-volatile memory device, and more particularly, to a resistance variable memory device for performing memory operations in accordance with resistance variances.

2. Related Art

Recently, next generation memory devices for substituting a DRAM and a flash memory have been studied. The next generation memory devices may include a resistance variable memory device. The resistance variable memory device may include a material such as a resistance variable material that may be changed by an applied bias to switch to different resistance states. The resistance variable memory device may include a phase changeable RAM (PCRAM), a magnetic RAM (MRAM), a ferroelectric RAM (FeRAM), a resistive RAM (ReRAM), etc.

The resistance variable memory device may include a memory cell array having a cross point array structure. The cross point array structure may be arranged between word lines and bit lines at which an access element and a memory cell may intersect.

However, in the resistance memory device, particularly, the PCRAM, a snapback and an overshoot may be generated when the memory cell is turned-on due to characteristics of a resistance layer in the memory cell to generate a transient current. Further, after the snapback or the overshoot, a spike current may be generated when returning to normal write operation.

The transient current, such as the snapback current, the overshoot current, and the spike current, may cause malfunctions of the memory cell. Particularly, the transient current may be generated in a cell group adjacent to a control circuit block for providing a voltage and a current.

SUMMARY

In example embodiments of the present disclosure, a resistance variable memory device may include a plurality of memory cells and a control circuit block. The plurality of memory cells may be connected between a global word line and a global bit line. The control circuit block may control the plurality of memory cells. The control circuit block may include a write pulse control block. The write pulse control block may include a high resistance path circuit and a bypass circuit connected between the global word line and a selected memory cell. The write pulse control block may selectively enable any one of the high resistance path circuit and the bypass circuit in accordance with a position the selected memory cell.

In example embodiments of the present disclosure, a resistance variable memory device may include a memory cell array and a control circuit block. The memory cell array may include a plurality of word lines, a plurality of bit lines, and a plurality of memory cells arranged at intersection portions between the plurality of word lines and the plurality of bit lines. The control circuit block may be arranged at an edge portion of the memory cell array to control the plurality of memory cells. The control circuit block may include a detection circuit block and a write pulse control block. The detection circuit block may detect a turn-on of a selected memory cell to generate a detection signal in accordance with detection results. The write pulse control block may selectively connect a high resistance path circuit and a bypass circuit with a word line, which may be connected to the selected memory cell, in accordance with the detection signal and address information of the selected memory cell.

According to example embodiments, when a memory cell in a cell group adjacent to the control circuit block is selected, the high resistance path circuit may be connected to the global word line or the selected word line after the turn-on of the memory cell. Thus, during returning to a write operation after the turn-on of the memory cell, generation of a transient current may be reduced.

Further, a voltage control circuit and a current control circuit may be installed at the global bit line and the global word line, respectively. Therefore, before the turn-on of the selected memory cell, a minimum voltage and a minimum current may be supplied to the memory cell to turn-on the memory cell. After the turn-on of the memory cell, a normal voltage and a normal current may be supplied to the memory cell. As a result, a snapback current and an overshoot current, which may be generated at the turn-on of the memory cell, may be decreased.

BRIEF DESCRIPTION OF THE DRAWINGS

The above and other aspects, features, and advantages of the subject matter of the present disclosure are understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, embodiments of the present teachings should not be construed as limiting the present teachings. Although a limited number of possible embodiments for the present teachings are shown and described, it will be appreciated by those of ordinary skill in the art that changes may be made in these embodiments without departing from the principles and spirit of the present invention.

Figure 1:
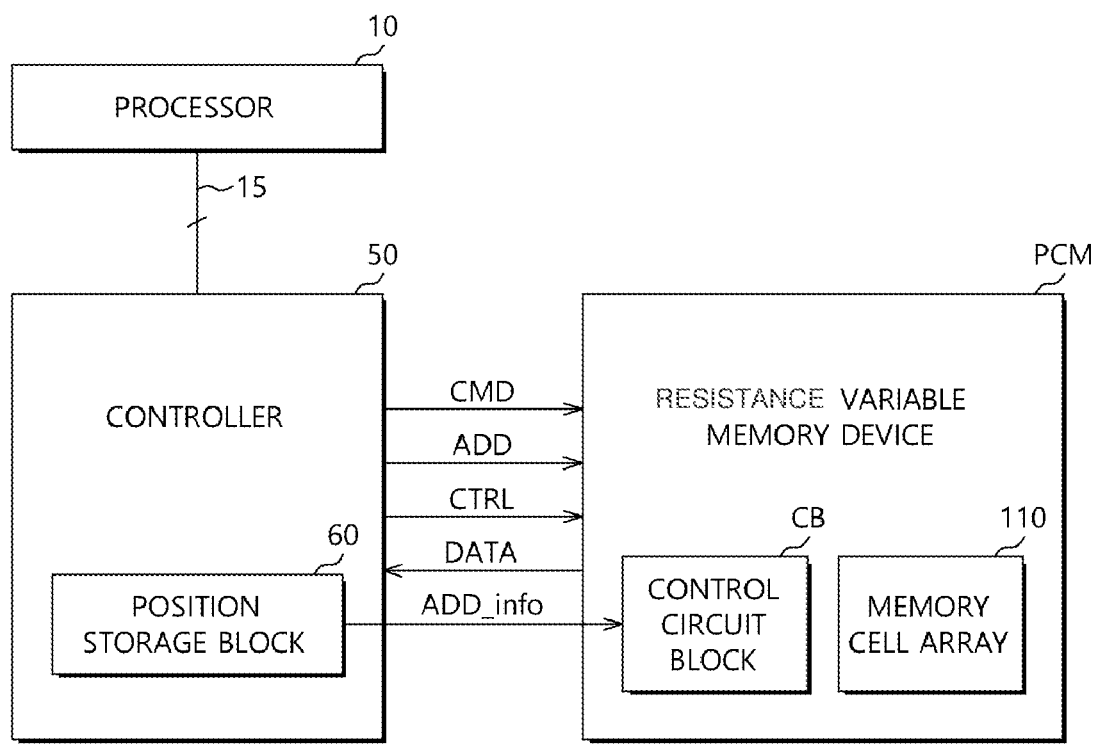
FIG. 1 is a block diagram illustrating a resistance variable memory system in accordance with example embodiments.

FIG. 1 is a block diagram illustrating a resistance variable memory system in accordance with example embodiments.

Referring to FIG. 1, a semiconductor system 100 may include a processor 10, a controller 50, and a resistance variable memory device PCM.

The processor 10 may be connected with the controller 50 via a bus 15. The processor 10 may provide the controller 50 with a memory access request (a read request, a write request, etc.,) including a memory address and data.

The controller 50 may provide the resistance variable memory device PCM with a command CMD, an address ADD, data DATA, and a control signal CTRL for operating the resistance variable memory device PCM. The controller 50 may include a position storage block 60. The position storage block 60 may store position information of memory cells in a memory cell array 110 of the resistance variable memory device PCM. For example, the position storage block 60 may classify the memory cells into memory cells in a near cell group and memory cells in a far cell group based on addresses of the memory cells. The position storage block 60 may include a register. The resistance variable memory device PCM may include the memory cell array 110 and a control circuit block CB.

In example embodiments, the controller 50 may include the position storage block 60. Alternatively, the control circuit block CB of the resistance variable memory device PCM may include the position storage block 60.

Figure 2:
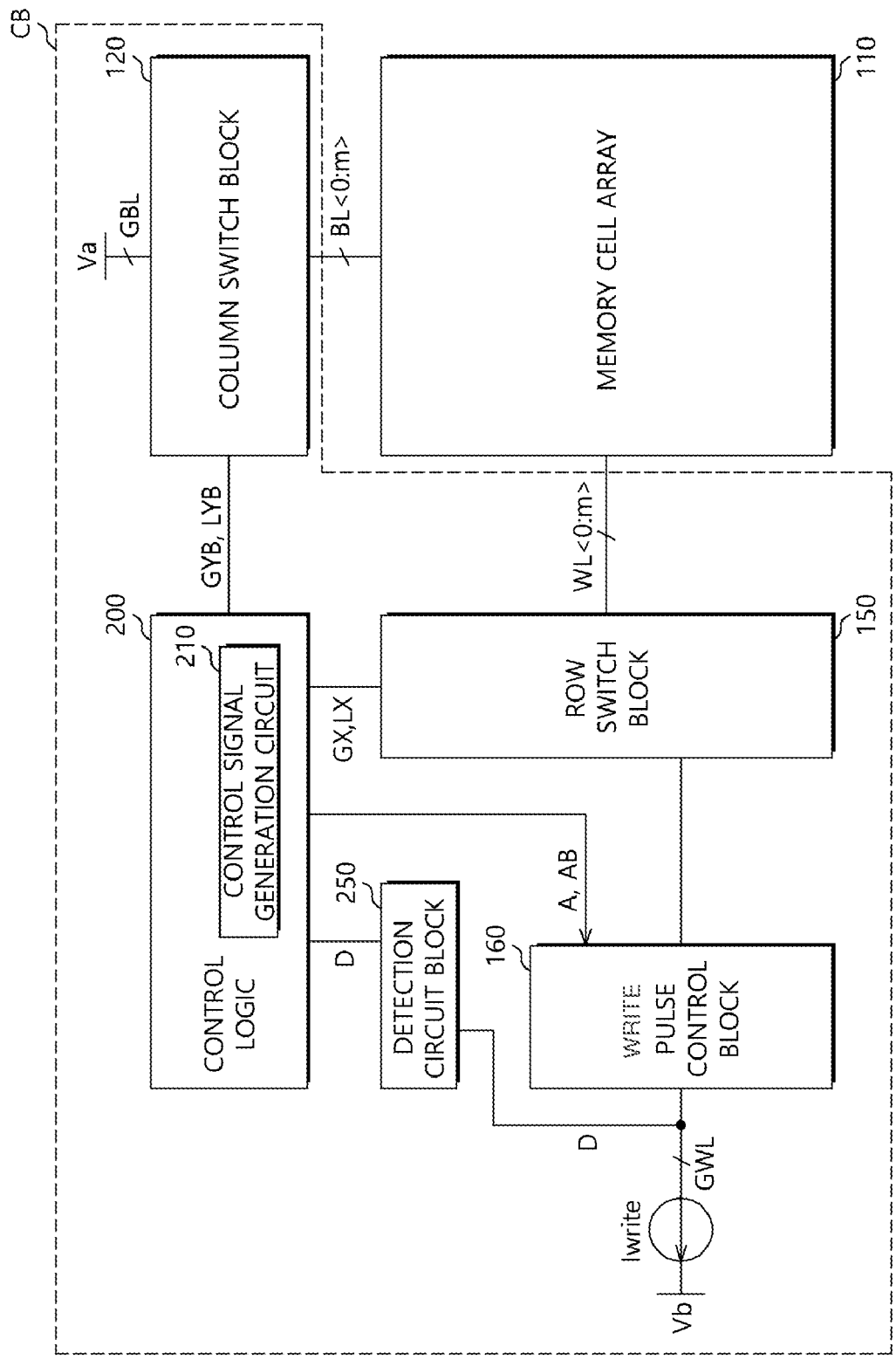
FIG. 2 is a view illustrating a resistance variable memory device in accordance with example embodiments.
Figure 3:
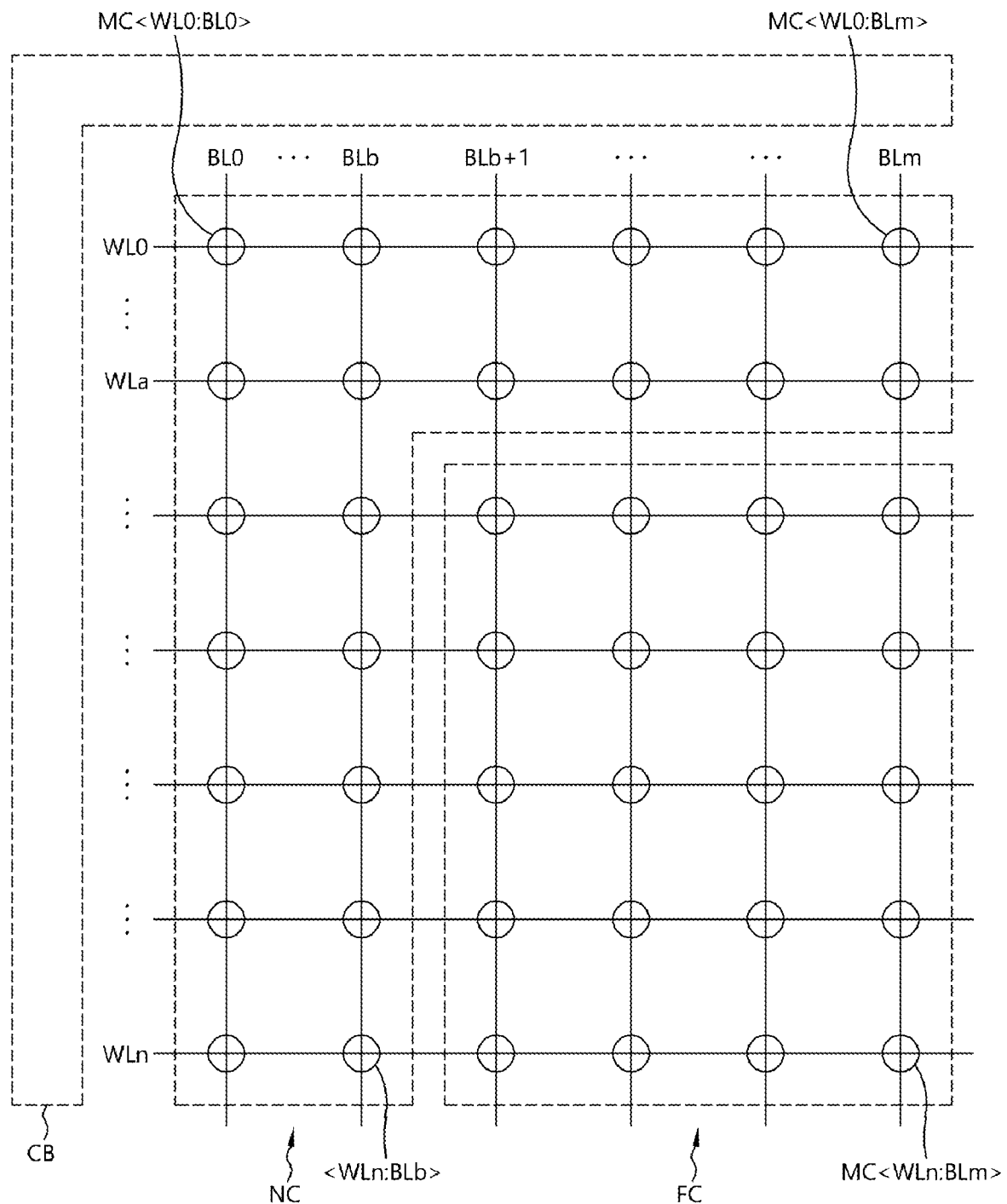
FIG. 3 is a view illustrating a memory cell array of a resistance variable memory device in accordance with example embodiments.
Figure 4:
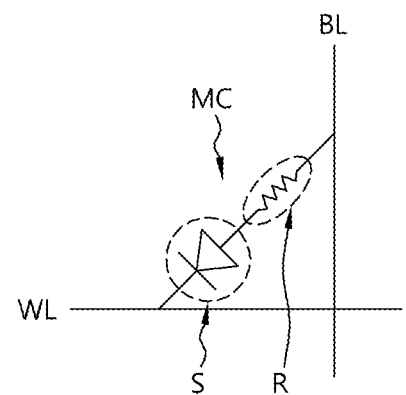
FIG. 4 is a circuit diagram illustrating a memory cell structure in accordance with example embodiments.

FIG. 2 is a view illustrating a resistance variable memory device in accordance with example embodiments, FIG. 3 is a view illustrating a memory cell array of a resistance variable memory device in accordance with example embodiments, and FIG. 4 is a circuit diagram illustrating a memory cell structure in accordance with example embodiments.

Referring to FIG. 2, the resistance variable memory device PCM may include the memory cell array 110 and the control circuit block CB for controlling operations of the memory cell array 110.

Referring to FIGS. 2 and 3, the memory cell array 110 may include a plurality of word lines WL0~WLn and a plurality of bit lines BL0~BLm. The word lines WL0~WLn and the bit lines BL0~BLm may intersect each other. Memory cells MC may be arranged at intersection points between the word lines WL0~WLn and the bit lines BL0~BLm. This structure may be referred to as a cross point array structure.

The memory cells MC of the memory cell array 110 may be classified into the near cell group NC and the far cell group FC in accordance with distances between the memory cells MC and the control circuit block CB. That is, the memory cells MC adjacent to the control circuit block CB may be defined as the near cell group NC. In contrast, the memory cells MC remote from the control circuit block CB may be defined as the far cell group FC. Position information of the near cell group NC and the far cell group FC may be stored in the position storage block 60.

In example embodiments, the position storage block 60 may classify the memory cells MC (MC<WL0~WLa:BL0~BLm> and MC<WL0~WLmn:BL0~BLb> near to the control circuit block CB>) as the near cell group NC. The position storage block 60 may classify the memory cells MC (MC<WL$_{a+1}$~WLn:BL$_{b+1}$~BLm>) spaced from the control circuit block CB as the far cell group FC. When an address of a selected memory cell is inputted into the position storage block 60, the position storage block 60 may determine whether the selected memory cell belongs to the near cell group NC or the far cell group FC. The position storage block 60 may then output determined results as address information. For example, the position storage block 60 may include a mode register set (MRS). The MRS may include address information for distinguishing the near cell group NC and the far cell group FC from each other.

Referring to FIG. 4, the memory cell MC may include a selection element S and a variable resistance R connected between the word line WL and the bit line BL.

The selection element S may include a diode or a MOS transistor. The selection element S may include an Ovonic threshold switch (OTS) including a phase change memory layer.

The variable resistance R may include a memory layer. The variable resistance R may represent different resistance values by voltage differences between the bit line BL and the word line WL. The variable resistance R may include a phase change layer or a resistance change layer. The phase change layer may include a two-element mixture such as GaSb, InSb, InSe, $Sb_2Te_3$, GeTe, etc., a three-element mixture such as GeSbTe, GaSeTe, InSbTe, $SnSb_2Te_4$, InSbGe, etc., a four-element mixture such as AgInSbTe, (GeSn)SbTe, GeSb(SeTe), $Te_{81}Ge_{15}Sb_2S_2$, etc.

The phase change layer may have an amorphous state having a relatively high resistance and a crystalline state having a relatively low resistance. The phase change layer may have variable phases in accordance with Joule's heat generated by a current amount and a cooling time.

Each of the memory cells MC may include a single level of a cell for storing one bit of data. In this case, the memory cell MC may have two resistance distributions in accordance with stored data. Further, each of the memory cells MC may be a multi-level cell for storing at least two bits of data. In this case, the memory cell MC may have four or eight resistance distributions in accordance with stored data.

Referring to FIG. 2, the control circuit block CB may include a column switch block 120, a row switch block 150, a write pulse control block 160, a control logic 200, and a detection circuit 250.

The column switch block 120 may be electrically coupled between a global bit line GBL and the bit lines BL<0:m>.

The column switch block 120 may select any one of the bit lines BL<0:m> in response to column selection signals GYB and/or LYB provided from the control logic 200. For example, the global bit line GBL may be connected to a bit line voltage terminal Va. The bit line voltage terminal Va may be a voltage source for providing a write voltage or a read voltage.

The row switch block 150 may be electrically coupled between a global word line GWL and the word lines WL<0:n>. The row switch block 150 may select any one of the word lines WL<0:n> in response to row selection signals GX and/or LX provided from the control logic 200. For example, the global word line GWL may be connected to a current source Iwrite for providing a write current. The current source Iwrite may be coupled to a word line voltage terminal Vb.

Although not depicted in drawings, the global bit line GBL and the global word line GWL may include a plurality of lines. By a hierarchy structure, a plurality of local bit lines or local word lines may be electrically coupled to one global bit line or one global word line, and a plurality of the bit lines or the word lines may be connected to one local bit line or one local word line, respectively.

Figure 5:
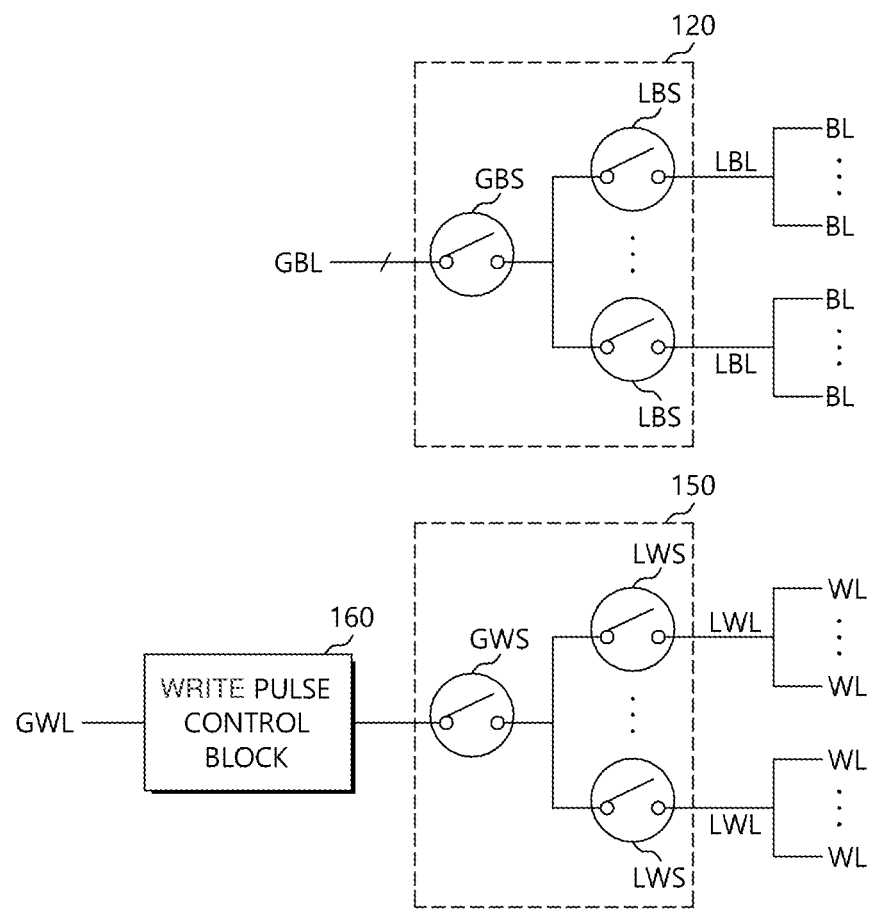
FIG. 5 is a view illustrating a hierarchy structure of a word line and a bit line in accordance with example embodiments.

FIG. 5 is a view illustrating a hierarchy structure of a word line and a bit line in accordance with example embodiments.

Referring to FIG. 5, in order to select any one of the bit lines BL arranged in the hierarchy shape, the column switch block 120 may include a global bit line switch GBS and a local bit line switch LBS connected between one global bit line GBL and one bit line BL. In order to select any one of the word lines WL arranged in the hierarchy shape, the row switch block 150 may include a global word line switch GWS and a local word line switch LWS connected between one global word line GWL and one word line WL.

The write pulse control block 160 may be electrically coupled between the global word line GWL and the memory cell array. Particularly, the write pulse control block 160 may be connected with the global word line GWL and the row switch block 150 to control a current amount applied to the global word line GWL and a selected word line WL. For example, the write pulse control block 160 may select a transmission path of a write current from the global word line GWL to the selected word line WL based on an address of a selected memory cell and a turn-on of the selected memory cell. The write current may be transmitted to the selected word line through a high resistance path or a bypass by the operations of the write pulse control block 160.

Figure 6:
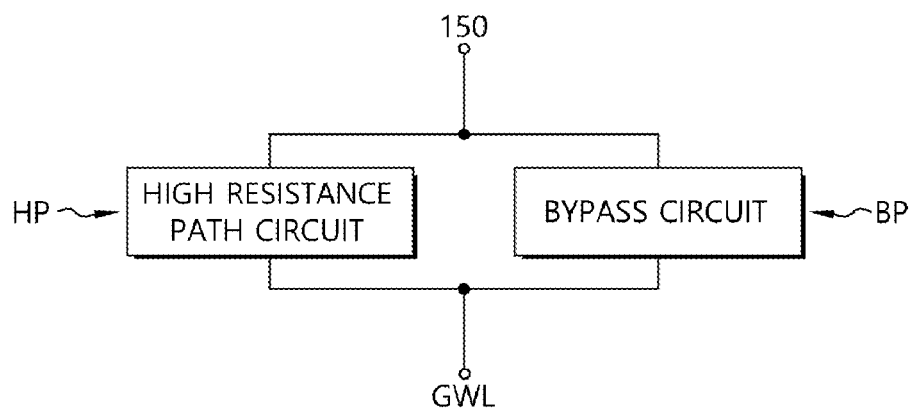
FIG. 6 is a circuit diagram illustrating a write pulse control block in accordance with example embodiments.
Figure 7:
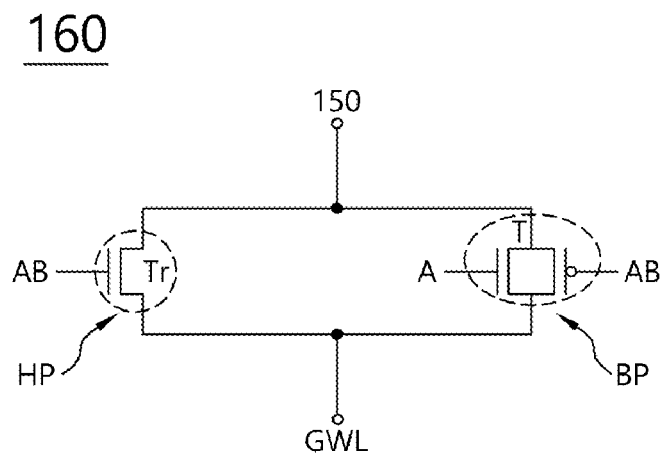
FIGS. 7 to 9 are detailed circuit diagrams illustrating a write pulse control block in accordance with example embodiments.
Figure 8:
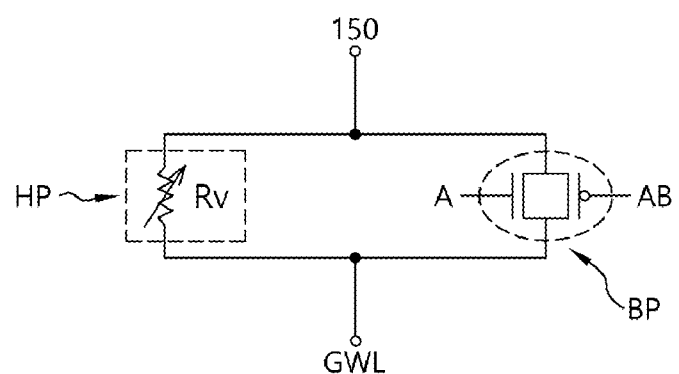
Figure 9:
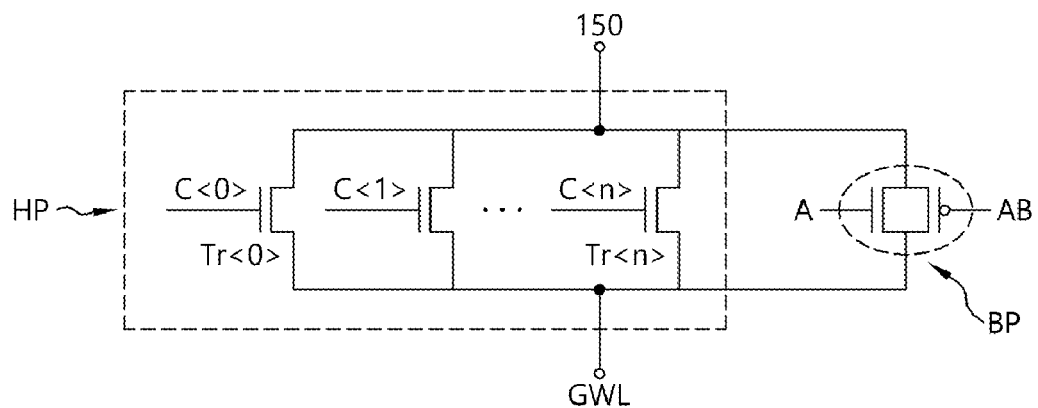

FIG. 6 is a circuit diagram illustrating a write pulse control block in accordance with example embodiments, and FIGS. 7 to 9 are detailed circuit diagrams illustrating a write pulse control block in accordance with example embodiments.

Referring to FIG. 6, the write pulse control block 160 may include a high resistance path circuit HP and a bypass circuit BP. The high resistance path circuit HP and the bypass circuit BP may be parallelly connected between the row switch block 150 and the global word line GWL.

Referring to FIG. 7, the high resistance path circuit HP may include a transistor having a high resistance, hereinafter referred to as a high resistance transistor Tr. The high resistance transistor Tr may be driven in response to a control signal AB. The high resistance transistor Tr may include an NMOS transistor. The control signal AB for driving the high resistance transistor Tr may include a VDD voltage or a VSS voltage. For example, when the VSS voltage may be used as a gate voltage AB of the high resistance transistor Tr, a gate source voltage Vgs of the high resistance transistor Tr may be lower than a gate source voltage of the high resistance transistor Tr when the VDD voltage may be used as the gate voltage AB. Thus, when the VSS voltage may be used as the gate voltage AB under a condition that a same resistance may be used, a size W/L (W: channel width, L: channel length) of the high resistance transistor Trr may be reduced. In example embodiments, the high resistance transistor Tr may include the NMOS transistor. Alternatively, the high resistance transistor Tr may include a PMOS transistor. Here, the control signal AB may be a signal for inverting the control signal AB. For example, when the memory cell MC of the near cell group NC may be selected, the control signal AB may be enabled to a high level. The generations of the control signals A and AB may be illustrated later in detail.

For example, when the memory cell of the near cell group NC may be selected and turned-on, the control signal AB may be enabled to a high level so that the high resistance path circuit HP may be connected between the global word line GWL and the row switch block 150. Thus, the write current applied to the global word line GWL may pass through the high resistance path circuit HP to decrease a value of the write current.

When the memory cell of the near cell group NC may be selected without the turn-on of the memory cell or the memory cell of the far cell group FC may be selected and turned-on, the control signal AB may be enabled so that the bypass circuit BP may be connected between the global word line GWL and the row switch block 150. Thus, the write current applied to the global word line GWL may be transmitted to the selected word line through the bypass circuit BP without decreasing of the write current.

In example embodiments, the high resistance path circuit HP may include the NMOS transistor. Alternatively, the high resistance path circuit HP may include a variable resistance Rv for providing a resistance path higher than that of the bypass circuit BP. For example, the variable resistance Rv may be higher than a resistance of a selected bypass circuit BP and lower than a resistance of a non-selected bypass circuit BP. Further, the variable resistance Rv may provide a resistance value higher than that of the selected bypass circuit BP in response to the control signal AB.

Referring to FIG. 9, the high resistance path circuit HP may include a plurality of transistors tr<0:n> parallelly connected with each other. For example, the transistors tr<0:n> may be selectively driven in response to a current control signal C<0:n>. The current control signal C<0:n> may be generated from the control logic 200 in FIG. 2. The resistance of the high resistance path circuit HP may be controlled by turned-on numbers of the transistor tr<0:n>. That is, when the majority of the transistors tr<0:n> may be turned-on, the high resistance path circuit HP may have a relatively low resistance. In contrast, when the minority of the transistors tr<0:n> may be turned-on, the high resistance path circuit HP may have a relatively high resistance.

The bypass circuit BP may include a transfer gate T including an NMOS transistor and a PMOS transistor. The NMOS transistor and the PMOS transistor of the bypass circuit BP may have a resistance greatly lower than the resistance of the high resistance path circuit HP. The NMOS transistor of the bypass circuit BP may be driven in response to a control signal A. The PMOS transistor of the bypass circuit BP may be driven in response to the control signal AB.

Referring to FIG. 2, the detection circuit block 250 may detect a current flowing through the selected memory cell MC. Further, when the selected memory cell MC may be turned-on, the detection circuit block 250 may generate a detection signal D. The detection circuit block 250 may then provide the control logic 200 with the detection signal D.

Figure 10:
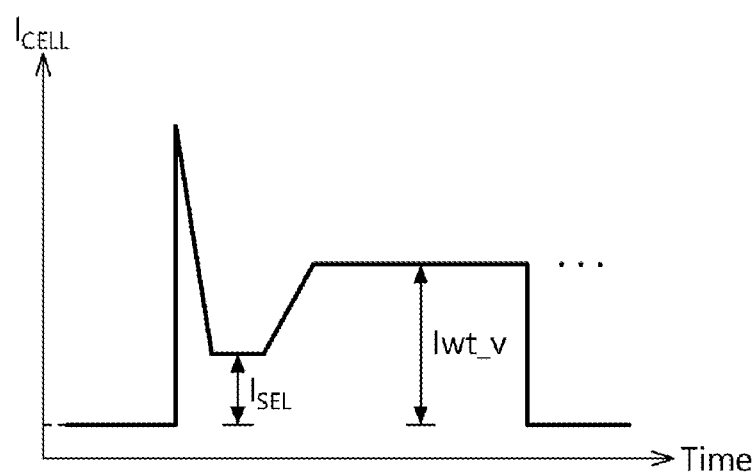
FIG. 10 is a graph showing an operational current at a write operation of a resistance variable memory device in accordance with example embodiments.

FIG. 10 is a graph showing an operational current at a write operation of a resistance variable memory device in accordance with example embodiments.

Referring to FIG. 10, when a memory cell of a general resistance variable memory device may be selected by initiating a write operation, a current lower than a write current may flow through the selected memory cell. When a voltage difference of no less than a critical voltage may be generated between a selected word line and a selected bit line, a memory layer of a variable resistance may be charged so that a great amount of the write current may flow through the selected memory cell. In contrast, the detection circuit block 250 of example embodiments may be connected with the global word line GWL. The detection circuit block 250 may detect a turn-on point of the memory cell MC using a current amount of the selected memory cell MC. In example embodiments, the detection circuit block 250 may include a sense amplifier.

The control logic 200 may include a control signal generation circuit 210 for generating the control signals A and AB.

Figure 11:
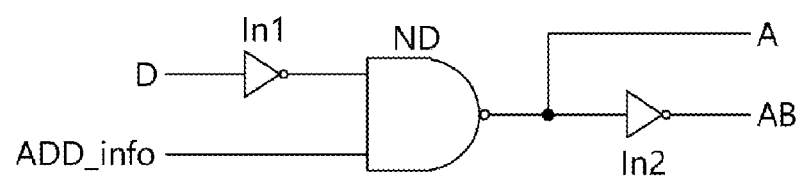
FIG. 11 is a circuit diagram illustrating a control signal generation circuit in accordance with example embodiments.

FIG. 11 is a circuit diagram illustrating a control signal generation circuit in accordance with example embodiments.

Referring to FIG. 11, the control signal generation circuit 210 may receive the detection signal D and address information ADD_info provided from the position storage block 60 of the controller 50 to generate the first control signal A and the second control signal AB. For example, when a selected memory cell MC corresponds to the near cell group NC, the address information ADD_info may be a high level of a signal. In contrast, when a selected memory cell MC corresponds to the far cell group FC, the address information ADD_info may be a low level of a signal.

For example, when the selected memory cell MC is turned-on, the detection signal D may be enabled to a high level. When the selected memory cell MC corresponds to the near cell group NC, the control signal generation circuit 210 may generate the first control signal A having a low level and the second control signal AB having a high level to enable the high resistance path circuit HP in the write pulse control block 160.

In contrast, when the selected memory cell MC of the far cell group FC is turned-on and the detection signal D is enabled to a high level or the selected memory cell MC is not turned-on, the control signal generation circuit 210 may generate the first control signal A having a high level and the second control signal AB having a low level to enable the high resistance path circuit HP in the write pulse control block 160.

Particularly, as shown in FIG. 6, the control signal generation circuit 210 may include a first inverter In1, a NAND gate ND and a second inverter In2.

The NAND gate ND may receive the detection signal D inverted by the first inverter In1 and the address information ADD_info to output the first control signal A. The second inverter In2 may receive the first control signal A. The second inverter In2 may then invert the first control signal A to output the second control signal AB.

In example embodiments, the control signal generation circuit 210 may include the inverters and the NAND gate. Alternatively, the control signal generation circuit 210 may include various logic circuits.

Further, although not depicted in drawings, the control logic 200 may include various circuits as well as the control signal generation circuit 210 to generate the column selection signals GYB and LYB, the row selection signals GX and LX, the current control signal C<0:n> and various control signals.

Figure 12:
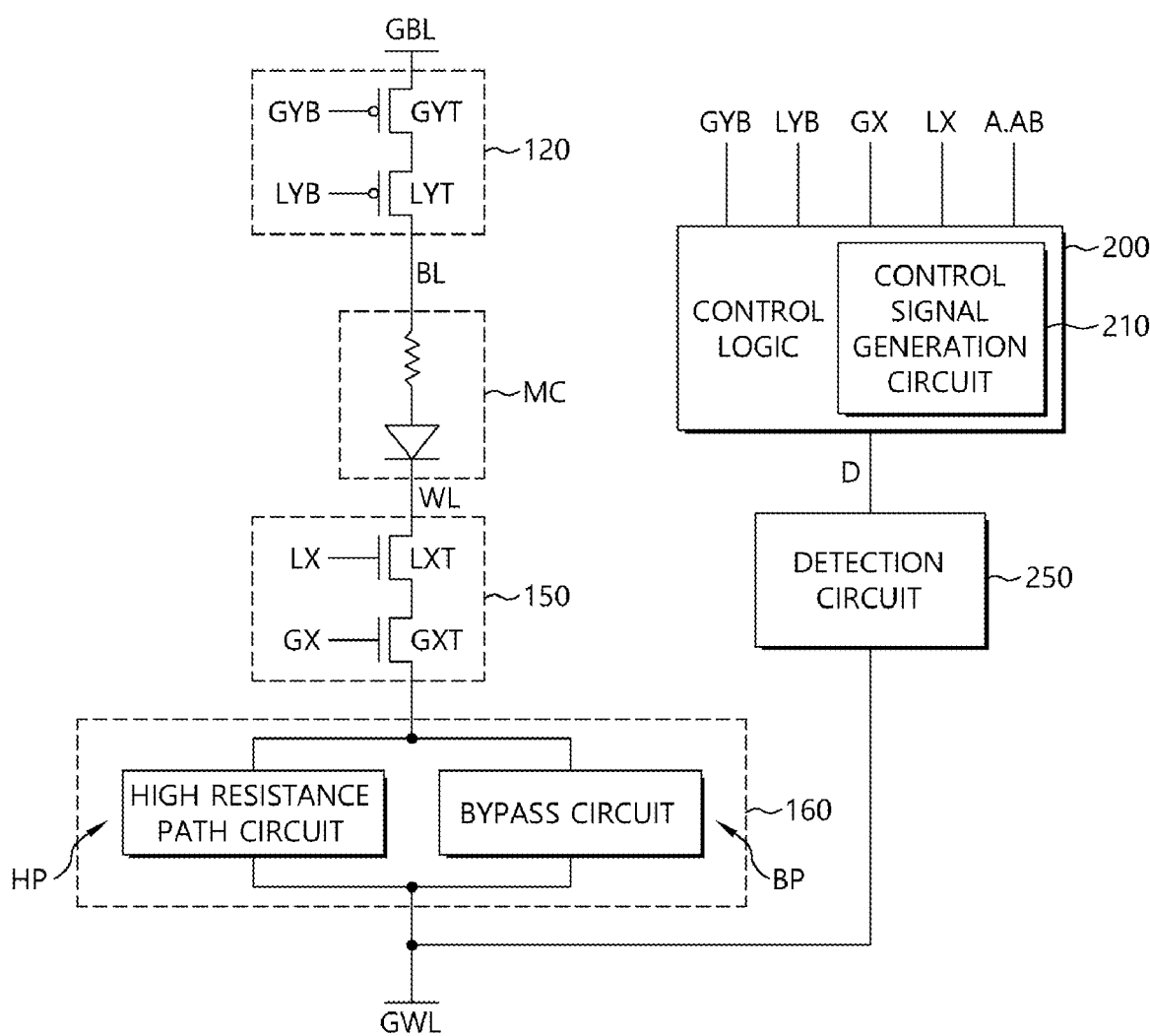
FIG. 12 is a circuit diagram illustrating operations of a resistance variable memory device in accordance with example embodiments.

FIG. 12 is a circuit diagram illustrating operations of a resistance variable memory device in accordance with example embodiments.

Referring to FIG. 12, when a write operation is initiated, the write current may be applied to the global bit line GBL electrically connected to the selected memory cell. Further, a word line voltage and the write current may also be applied to the selected global word line GWL.

The control logic 200 may output the column selection signals GYB and LYB and the row selection signals GX and LX to the column switch block 120 and the row switch block 150, respectively, based on the address ADD provided from the controller 50.

When the global bit line switch GYT and the local bit line switch LYT of the column switch block 120 are turned-on in response to the column selection signals GYB and LYB, the write voltage Va applied to the global bit line GBL may be transmitted to the selected bit line BL.

When the global word line switch GXT and the local word line switch LXT of the row switch block 150 are turned-on in response to the row selection signals GX and LX, the word line voltage applied to the global word line GWL may be transmitted to the selected word line WL.

Because a sufficient voltage difference might not be generated between the word line WL and the bit line BL at a beginning of the write operation, the memory layer R in the variable resistance of the memory cell MC might not be charged. Thus, a current lower than a set write current may flow through the global word line GWL so that the detection circuit block 250 may output the disabled detection signal D to the control signal generation circuit 210. Therefore, the control signal generation circuit 210 may output the first control signal A and the second control signal AB for enabling the bypass circuit BP of the write pulse control block 160.

When the sufficient voltage difference is generated between the word line WL and the bit line BL after a certain time, the memory cell MC may be turned-on. The current amount of the global word line GWL may be remarkably increased so that the detection circuit block 250 may provide the control signal generation circuit 210 with the enabled detection signal D. When the turned-on memory cell MC may correspond to the near cell group NC, the control signal generation circuit 210 may output the first control signal A and the second control signal AB for enabling the high resistance path circuit HP of the write pulse control block 160. In contrast, when the turned-on memory cell MC may correspond to the far cell group FC, the control signal generation circuit 210 may output the first control signal A and the second control signal AB for enabling the bypass circuit BP of the write pulse control block 160.

For example, when the high resistance path circuit HP may be connected in the write pulse control block 160 after turning-on the memory cell MC, a spike current, which may be more severely generated in the near cell group NC, may pass through the high resistance path circuit HP to decrease the spike current. Thus, after turning-on the memory cell MC, the stable write current may be supplied to the memory cell MC. As a result, a disturbance error of the memory cell caused by the spike current in the write current may be prevented.

When the bypass circuit BP may be connected in the write pulse control block 160, the write current applied to the global word line GWL may be provided to the turned-on memory cell MC without loss of the write current.

Generally, in order to prevent the disturbance of the memory cell in the near cell group, a technology for controlling a driving force of the local word line switch LXT of the local switch block may be used. However, in order to control the driving force of the local word line switch LXT, various row selection voltage sources (local word line voltages) and various row selection voltage lines may be required. Thus, it may be very difficult to apply the technology to a small memory cell array.

However, according to example embodiments, the write pulse control block 160 having the simple switch structure may be connected with the global word line GWL to control the spike current of the near cell group NC so that the resistance variable memory device may have advantageous layouts.

Figure 13:
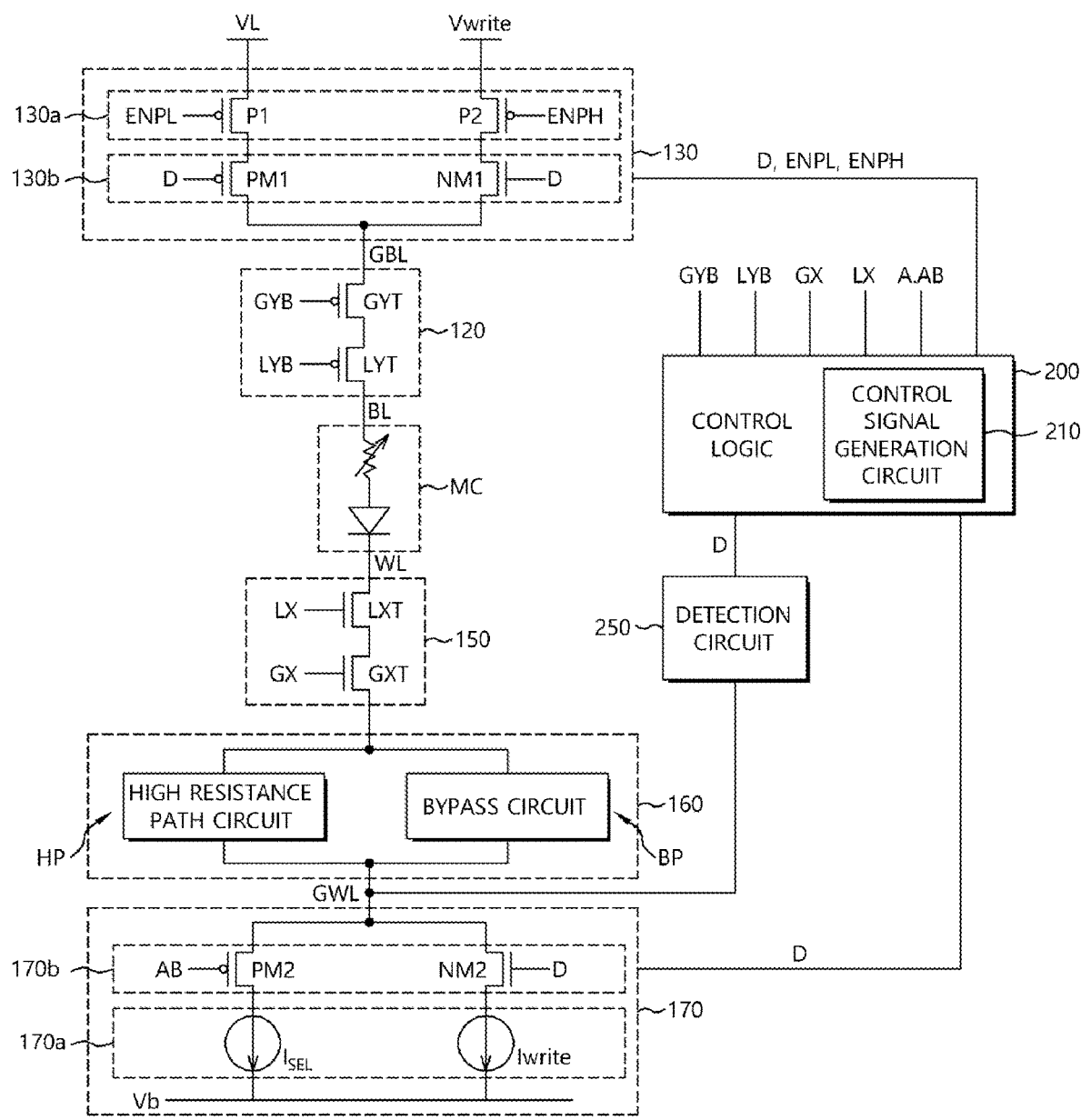
FIG. 13 is a circuit diagram illustrating a resistance variable memory device in accordance with example embodiments.

FIG. 13 is a circuit diagram illustrating a resistance variable memory device in accordance with example embodiments.

Referring to FIG. 13, a resistance variable memory device PCMa of this example embodiment may include elements substantially the same as those of the resistance variable memory device PCM in FIG. 2 except for further including a voltage control circuit 130 and a current control circuit 170. Thus, the same reference may refer to the same elements and any further illustrations with respect to the same elements may be omitted herein for brevity.

The voltage control circuit 130 may be connected with the global bit line GBL to provide a voltage. The voltage control circuit 130 may transmit an initial voltage VL to the global bit line GBL after turning-on the memory cell MC. The voltage control circuit 130 may transmit a write voltage Vwrite to the global bit line GBL after turning-on the memory cell MC. The initial voltage VL may have a minimum level for maintaining the turn-on of the memory cell MC. The voltage control circuit 130 may include a voltage-providing circuit 130a and a voltage-selecting circuit 130b.

The voltage-providing circuit 130a may include a first switch P1 and a second switch P2. The first switch P1 may provide the voltage-selecting circuit 130b with the initial voltage VL in response to a first drive signal ENPL. The second switch P2 may provide the voltage-selecting circuit 130b with the write voltage Vwrite in response to a second drive signal ENPH. The first drive signal ENPL and the second drive signal ENPH may be generated from the control logic 200. For example, the first drive signal ENPL may be a signal enabled before generating the detection signal D. The second drive signal ENPH may be a signal enabled after generating the detection signal D. For example, when the first and second switches P1 and P2 may include PMOS transistors, the first and second drive signals ENPL and ENPH may be enabled at low levels.

In order to apply the initial voltage VL to the global bit line GBL before generating the detection signal D, the voltage-selecting circuit 130b may electrically connect the global bit line GBL with the first switch P1. In order to apply the write voltage Vwrite to the global bit line GBL after generating the detection signal D, the voltage-selecting circuit 130b may electrically connect the global bit line GBL with the second switch P2. For example, the voltage-selecting circuit 130b may include a PMOS transistor PM1 driven in response to the detection signal D, and an NMOS transistor NM1 driven in response to the detection signal D. When the detection signal D may be disabled, the PMOS transistor PM1 may electrically connect the first switch P1 with the global bit line GBL. When the detection signal D may be enabled, the NMOS transistor NM1 may electrically connect the second switch P2 with the global bit line GBL. In example embodiments, the voltage-selecting circuit 130b may include the PMOS transistor PM1 and the NMOS transistor NM1. Alternatively, the voltage-selecting circuit 130b may include various selecting circuits.

The current control circuit 170 may be connected with the global word line GWL to provide a current. The current control circuit 170 may be connected between the global word line GWL and the word line voltage terminal Vb. The current control circuit 170 may provide an initial current Isel in accordance with the initial voltage before turning-on the memory cell MC. The current control circuit 170 may provide a write current Iwrite in accordance with the write voltage after turning-on the memory cell MC.

The current control circuit 170 may include a current-providing circuit 170a and a current-selecting circuit 170b. The current-providing circuit 170a may include an initial current source Isel and a write current source Iwrite connected to the word line voltage terminal Vb. For example, the initial current source Isel may provide the initial current corresponding to the initial voltage VL. The write current source Iwrite may provide the write current corresponding to the write voltage Vwrite.

The current-selecting circuit 170b may include a PMOS transistor PM2 driven in response to the detection signal D, and an NMOS transistor NM2 driven in response to the detection signal D. When the detection signal D may be disabled to a low level, the PMOS transistor PM2 may electrically connect the initial current source Isel with the write pulse control block 160. When the detection signal D may be enabled to a high level, the NMOS transistor NM2 may electrically connect the write current source Iwrite with the write pulse control block 160. In example embodiments, the current-selecting circuit 170b may include the PMOS transistor PM2 and the NMOS transistor NM2. Alternatively, the current-selecting circuit 170b may include various selecting circuits.

When the memory cell MC may be selected before turning-on the selected memory cell MC, the minimum voltage VL and the minimum current Isel may be applied to the selected memory cell MC by driving the voltage control circuit 130 and the current control circuit 170 to maintain the turning-on of the memory cell MC. Thus, because the voltage and the current applied to the memory cell MC at the beginning of the selection may be very small, the snapback current (voltage) and the overshoot current (voltage) generated simultaneously with the turning-on of the selected memory cell MC may also be decreased. Therefore, influences of the snapback current (voltage) and the overshoot current (voltage) on the memory cell may be remarkably reduced. When the detection signal D may be detected after turning-on the memory cell MC, the voltage control circuit 130 and the current control circuit 170 may provide the memory cell with the write voltage Vwrite and the write current Iwrite so that the memory cell MC may perform the normal write operation.

According to example embodiments, when the memory cell of the near cell group adjacent to the control circuit block may be selected, the high resistance path may be connected to the global word line or the selected word line after turning-on the memory cell. Therefore, generation of a transient current may be reduced during turning of the write operation after turning-on the memory cell.

Further, the voltage control circuit and the current control circuit may be installed at the global bit line and the global word line, respectively. Thus, the minimum voltage and the minimum current for maintaining the turn-on of the memory cell may be provided to the memory cell before turning-on the memory cell. The normal write voltage and current may be provided to the memory cell after turning-on the memory cell. As a result, the influences of the snapback current and the overshoot current generated at the turn-on of the memory cell may be decreased.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are obvious in view of the present disclosure and are intended to fall within the scope of the appended claims.

What is claimed is:

1. A resistance variable memory device comprising:
   a plurality of memory cells electrically coupled between a global word line and a global bit line; and
   a control circuit block for controlling the plurality of memory cells,
   wherein the control circuit block comprises a write pulse control block electrically coupled between the global word line and a selected memory cell among the plurality of memory cells to control a current flowing through the selected memory cell in accordance with a distance between the selected memory cell and the control circuit block, and
   wherein the write pulse control block comprises:
   a high resistance path circuit; and
   a bypass circuit,
      wherein any one of the high resistance path circuit and the bypass circuit is selectively connected between the global word line and the selected memory cell in accordance with the position of the selected memory cell.

2. The resistance variable memory device of claim 1, wherein the high resistance path circuit is enabled when a memory cell among memory cells near to the control circuit block is turned-on, and the bypass circuit is enabled when a memory cell among memory cells far from the control circuit block is turned-on.

3. The resistance variable memory device of claim 1, wherein the control circuit block comprises a detection circuit block configured to detect a turn-on of the selected memory cell based on the current of the selected memory cell and to generate a detection signal,
   wherein the write pulse control block enables any one of the high resistance path circuit and the bypass circuit in response to the detection signal and address information of the selected memory cell.

4. The resistance variable memory device of claim 3, wherein the control circuit block further comprises a control signal generation circuit for logically combining the detection signal provided form the detection circuit block with the address information of the selected memory cell to generate a control signal for enabling the high resistance path circuit and the bypass circuit of the write pulse control block.

5. The resistance variable memory device of claim 1, wherein the write pulse control block comprises a high resistance path circuit and a bypass circuit connected between the global word line and the selected memory cell in parallel, the high resistance path circuit comprises a MOS transistor, and the MOS transistor of the high resistance path circuit has a resistance higher than a resistance of when the bypass circuit is selected and lower than a resistance of when the bypass circuit is not selected.

6. The resistance variable memory device of claim 1, wherein the write pulse control block comprises a high resistance path circuit and a bypass circuit connected between the global word line and the selected memory cell in parallel, the high resistance path circuit comprises a variable resistance, and the variable resistance is higher than a resistance of when the bypass circuit is selected and lower than a resistance of when the bypass circuit is not selected.

7. The resistance variable memory device of claim 1, wherein the write pulse control block comprises a high resistance path circuit and a bypass circuit connected between the global word line and the selected memory cell in parallel, and the high resistance path circuit comprises a plurality of parallelly connected transistors selected in response to a plurality of current control signals.

8. The resistance variable memory device of claim 1, wherein the bypass circuit comprises a transfer gate including an NMOS transistor and a PMOS transistor.

9. The resistance variable memory device of claim 1, further comprising a voltage control circuit electrically coupled with the global bit line, wherein the voltage control circuit provides the selected memory cell with an initial voltage for maintaining a turn-on of the selected memory cell when the selected memory cell is not turned-on, and the voltage control circuit provides the selected memory cell with a write voltage when the selected memory cell is turned-on.

10. The resistance variable memory device of claim 1, further comprising a current control circuit electrically coupled with the global word line, wherein the current control circuit provides the selected memory cell with an initial current for maintaining a turn-on of the selected memory cell when the selected memory cell is not turned-on, and the current control circuit provides the selected memory cell with a write current when the selected memory cell is turned-on.

11. A resistance variable memory device comprising:
    a memory cell array including a plurality of word lines, a plurality of bit lines, and a plurality of memory cells arranged between the word lines and the bit lines; and
    a control circuit block arranged at an edge portion of the memory cell array to control the memory cells,
    wherein the control circuit block comprises:
    a detection circuit block configured to detect a turn-on of a selected memory cell among the plurality of memory cells to generate a detection signal in accordance with detection results, and
    a write pulse control block configured to selectively connect a word line among the plurality of word lines connected the selected memory cell with a high resistance path circuit and a bypass circuit in accordance with the detection signal and address information of the selected memory cell.

12. The resistance variable memory device of claim 11, wherein the write pulse control block is configured to enable the high resistance path circuit when the detection signal is enabled and the address of the selected memory cell is within a near cell group arranged near to the control circuit block, and the write pulse control block is configured to enable the bypass circuit when the detection signal is not enabled or the address of the selected memory cell is within a far cell group arranged far from the control circuit block.

13. The resistance variable memory device of claim 11, wherein the control circuit block further comprises a control signal generation circuit for logically combining the detection signal with the address information of the selected memory cell to generate a control signal for enabling the high resistance path circuit and the bypass circuit of the write pulse control block.

14. The resistance variable memory device of claim 11, further comprising a position storage block configured to classify the plurality of memory cells into a near cell group and a far cell group,
   wherein the near cell group includes memory cells having a first error ratio while being positioned near to the control circuit block, and
   the far cell group includes memory cells having a second error ratio lower than the first error ratio while being positioned far from the control circuit block.

15. The resistance variable memory device of claim 11, wherein the high resistance path circuit comprises a MOS transistor, and the MOS transistor of the high resistance path circuit has a resistance higher than a resistance of when the bypass circuit is selected and lower than a resistance of when the bypass circuit is not selected.

16. The resistance variable memory device of claim 11, wherein the high resistance path circuit comprises a variable resistance, and the variable resistance is higher than a resistance of when the bypass circuit is selected and lower than a resistance of when the bypass circuit is not selected.

17. The resistance variable memory device of claim 11, wherein the high resistance path circuit comprises a plurality of parallelly connected transistors selected in response to a plurality of current control signals.

18. The resistance variable memory device of claim 11, further comprising:
   a global bit line connected to the plurality of bit lines; and
   a voltage control circuit for providing the global bit line with a voltage,
   wherein the voltage control circuit provides the selected memory cell with an initial voltage for maintaining a turn-on of the selected memory cell when the selected memory cell is not turned-on, and the voltage control circuit provides the selected memory cell with a write voltage when the selected memory cell is turned-on.

19. The resistance variable memory device of claim 1, further comprising:
   a global word line connected to the plurality of word lines; and
   a current control circuit for providing the global word line with a current,
   wherein the current control circuit provides the selected memory cell with an initial current for maintaining a turn-on of the selected memory cell when the selected memory cell is not turned-on, and the current control circuit provides the selected memory cell with a write current when the selected memory cell is turned-on.

* * * * *